US008927437B2

(12) United States Patent
Ho et al.

(10) Patent No.: US 8,927,437 B2
(45) Date of Patent: Jan. 6, 2015

(54) ANTIREFLECTION STRUCTURES WITH AN EXCEPTIONAL LOW REFRACTIVE INDEX AND DEVICES CONTAINING THE SAME

(71) Applicant: National Tsing Hua University, Hsinchu (TW)

(72) Inventors: Rong-Ming Ho, Hsinchu (TW); Han-Yu Hsueh, Hsinchu (TW); Ming-Shiuan She, Hsinchu (TW); Hung-Ying Chen, Hsinchu (TW); Shangjr Gwo, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 1 day.

(21) Appl. No.: 13/961,017

(22) Filed: Aug. 7, 2013

(65) Prior Publication Data

US 2014/0004709 A1    Jan. 2, 2014

Related U.S. Application Data

(60) Division of application No. 13/005,637, filed on Jan. 13, 2011, now Pat. No. 8,518,561, which is a continuation-in-part of application No. 12/655,342, filed on Dec. 29, 2009, now abandoned.

(30) Foreign Application Priority Data

Jul. 3, 2009    (TW) ............................... 98122686 A

(51) Int. Cl.
| | |
|---|---|
| H01L 21/02 | (2006.01) |
| C09D 5/00 | (2006.01) |
| B82Y 30/00 | (2011.01) |
| B82Y 40/00 | (2011.01) |
| G02B 1/11 | (2006.01) |
| G02B 1/12 | (2006.01) |
| B05D 1/32 | (2006.01) |
| B05D 5/02 | (2006.01) |

(52) U.S. Cl.
CPC ................. *C09D 5/006* (2013.01); *B82Y 30/00* (2013.01); *B82Y 40/00* (2013.01); *G02B 1/118* (2013.01); *G02B 1/12* (2013.01); *H01L 21/02104* (2013.01); *B05D 1/322* (2013.01); *B05D 5/02* (2013.01)
USPC ........................................... 438/758; 438/778

(58) Field of Classification Search
USPC .......... 438/479, 780, 758; 427/595, 256, 240, 427/248.1, 530; 216/56, 58, 2, 41
See application file for complete search history.

(56) References Cited

U.S. PATENT DOCUMENTS

| | | |
|---|---|---|
| 6,348,707 B1 | 2/2002 | Linliu |
| 7,056,455 B2 | 6/2006 | Matyjaszewski et al. |

(Continued)

OTHER PUBLICATIONS

Han-Yu Hsueh et al., Inorganic Gyroid with Exceptionally Low Refractive Index from Block Copolymer Templating, Nano Lett. 2010, 10, pp. 4944-5000, published on Internet on Nov. 3, 2010.

(Continued)

*Primary Examiner* — Savitr Mulpuri
(74) *Attorney, Agent, or Firm* — Bacon & Thomas, PLLC

(57) ABSTRACT

Nanoporous polymers with gyroid nanochannels can be fabricated from the self-assembly of degradable block copolymer, polystyrene-b-poly(L-lactide) (PS-PLLA), followed by the hydrolysis of PLLA blocks. A well-defined nanohybrid material with $SiO_2$ gyroid nanostructure in a PS matrix can be obtained using the nanoporous PS as a template for the sol-gel reaction. After subsequent UV degradation of the PS matrix, a highly porous inorganic gyroid network remains, yielding a single-component material with an exceptionally low refractive index (as low as 1.1).

30 Claims, 2 Drawing Sheets

(56) References Cited

U.S. PATENT DOCUMENTS

| | | |
|---|---|---|
| 7,517,466 B2 | 4/2009 | Asakawa et al. |
| 7,799,416 B1 * | 9/2010 | Chan et al. ............... 428/304.4 |
| 7,897,458 B2 | 3/2011 | Lee et al. |
| 8,007,333 B2 * | 8/2011 | Pan et al. ..................... 445/24 |
| 8,529,779 B2 * | 9/2013 | Cheng et al. ................... 216/56 |
| 2003/0155004 A1 | 8/2003 | Takahashi et al. |
| 2003/0222048 A1 | 12/2003 | Asakawa et al. |
| 2004/0077156 A1 * | 4/2004 | Tsakalakos et al. .......... 438/479 |
| 2004/0265548 A1 * | 12/2004 | Ho et al. ..................... 428/195.1 |
| 2005/0256224 A1 | 11/2005 | Miyata et al. |
| 2006/0057051 A1 | 3/2006 | Dai et al. |
| 2006/0124467 A1 * | 6/2006 | Ho et al. ....................... 205/118 |
| 2006/0210929 A1 | 9/2006 | Yamada |
| 2006/0211816 A1 | 9/2006 | Ho et al. |
| 2006/0231525 A1 | 10/2006 | Asakawa et al. |
| 2006/0257565 A1 | 11/2006 | Jin et al. |
| 2008/0237692 A1 | 10/2008 | Lee et al. |
| 2009/0130380 A1 | 5/2009 | Asakawa et al. |
| 2009/0170342 A1 * | 7/2009 | Kim et al. ..................... 438/780 |
| 2011/0053043 A1 * | 3/2011 | Balsara et al. ................ 429/493 |
| 2011/0278533 A1 | 11/2011 | Hillhouse et al. |
| 2012/0037594 A1 | 2/2012 | Asakawa et al. |
| 2012/0041121 A1 | 2/2012 | Asakawa et al. |

OTHER PUBLICATIONS

Wen-Hsien Tseng et al., Helical Nanocomposites from Chiral Block Copolymer Templates, J. Am. Chem. Soc. 2009, 131, pp. 1356-1357, Published on Web in Jan. 8, 2009.

* cited by examiner

ANTIREFLECTION STRUCTURES WITH AN EXCEPTIONAL LOW REFRACTIVE INDEX AND DEVICES CONTAINING THE SAME

CROSS REFERENCE TO RELATED PATENT APPLICATIONS

The present patent application claims the benefit of Taiwan Patent Application Number 98122686 filed Jul. 3, 2009; and U.S. patent application Ser. No. 12/655,342, filed Dec. 29, 2009, the contents of which are hereby incorporated by reference in their entireties.

FIELD OF THE INVENTION

The present invention relates to an antireflection structure with an exceptional low refractive index, e.g. as low as 1.1.

BACKGROUND OF THE INVENTION

U.S. Pat. No. 7,135,523 B2 discloses a method for making a series of nanoscale microstructures, including helical microstructures and cylindrical microstructures. This method includes the steps of (1) forming a chiral block copolymer containing a plurality of chiral first polymer blocks and a second polymer blocks wherein the chiral first polymer blocks have a volume fraction ranging from 20 to 49%; (2) causing a phase separation in the chiral block copolymer. In a preferred embodiment, the chiral block copolymer is poly(styrene)-poly(L-lactide) (PS-PLLA) chiral block copolymer, and the copolymerization process is a living copolymerization process which includes the following steps: (a) mixing styrene with BPO and 4-OH-TEMPO to form 4-hydroxy-TEMPO-terminated polystyrene; and (2) mixing the 4-hydroxy-TEMPO-terminated polystyrene with $[(\eta_3\text{-EDBP})Li_2]_2[\eta_3\text{-}^nBu)Li(0.5Et_2O)]_2$ and L-lactide in an organic solvent preferably $CH_2Cl_2$ to form the poly(styrene)-poly(L-lactide) chiral block copolymer. Transmission electron microscopy (TEM) and small X-ray scattering (SAXS) studies show that when the volume fraction of poly(L-lactide) is about 35-37%, nanoscale helices with a pitch of 43.8 nanometers and a diameter of 34.4 nanometers were observed.

US patent publication 2004/0265548 A discloses a nanopatterned template for use in manufacturing nanoscale objects. The nanopatterned template contains a nanoporous thin film with a periodically ordered porous geomorphology which is made from a process comprising the steps of: (a) using a block copolymerization process to prepare a block copolymer comprising first and second polymer blocks, the first and second polymer blocks being incompatible with each other; (b) forming a thin film under conditions such that the first polymer blocks form into a periodically ordered topology; and (c) selectively degrading the first polymer blocks to cause the thin film to become a nanoporous material with a periodically ordered porous geomorphology. In a preferred embodiment, the block copolymer is poly(styrene)-b-poly(L-lactide) (PS-PLLA) chiral block copolymer, the first polymer is poly(L-lactide), and the second polymer is polystyrene. Experimental results show that the first polymer blocks can be formed into a hexagonal cylindrical geomorphology with its axis perpendicular to a surface of the thin film. After hydrolysis to selectively degrade the first polymer blocks, a thin film having a series of repeated nanoscale hexagonal-cylindrical channels is obtained.

US patent publication 2006/0124467 A discloses metal nanodot arrays and fabrication methods thereof. A film of a block copolymer is deposited on a conductive substrate. The block copolymer comprises first polymer and second polymer blocks, wherein the first polymer blocks have a periodically ordered morphology. The first polymer blocks are selectively degraded to form a nanopatterned template comprising periodically ordered nanochannels. By electroplating, metal is deposited into the nanochannels that expose the conductive substrate, thus forming a metal nanodot array.

Rong-Ming Ho, et al. in an article entitled, "Helical Nanocomposites from Chiral Block Copolymer Templates", J. AM. CHEM. SOC. 2009, 131, 1356-1357, disclose a three-dimensional ordered helical nanocomposite prepared with the combination of the self-assembly of a degradable block copolymer and sol-gel chemistry. PS with helical nanochannels is prepared first from the self-assembly of the PS-PLLA chiral block copolymer after hydrolysis, and then used as template. By exploiting the nanoreactor concept, sol-gel reaction is then carried out within the template so as to fabricate a helical nanocomposite. $SiO_2$ nanohelices can be obtained after degradation of PS template under UV exposure.

The inventors of the invention of the present application in an article, entitled "Inorganic Gyroid with Exceptionally Low Refractive Index from Block Copolymer Templating", Nano Lett. 2010, 10, 4944-5000, published on Internet on Nov. 3, 2010, disclose an antireflection structure of $SiO_2$ gyroid having an exceptional low refractive index, e.g. as low as 1.1, prepared by first forming a layer of PS-PLLA chiral block copolymer with spin coating and solvent annealing, followed by the hydrolysis, sol-gel process, and degradation of PS template described above.

Details of the disclosures in the aforesaid US patent and patent publication, and the aforesaid articles are incorporated herein by reference.

SUMMARY OF THE INVENTION

A primary objective of the present invention provides an antireflection structure with an exceptional low refractive index, e.g. as low as 1.1.

Another objective of the present invention provides a device with an antireflection structure with an exceptional low refractive index, such as flat panel displays, solar cells, omnidirectional reflectors, light-emitting diodes, LCD backlight modules, and windows.

In order to accomplish the objectives of the present invention an anti antireflection structure constructed according to the present invention comprises a substrate and on a surface of the substrate a layer of porous inorganic gyroid network. Preferably, the substrate is quartz, glass, polymer, or semiconductor. Preferably, the glass substrate is an indium tin oxide (ITO) glass substrate or carbon-coated glass substrate. Preferably, the semiconductor substrate is silicon wafer or silicon oxide substrate.

Preferably, the porous inorganic gyroid network is a ceramic oxide or ceramic mixed oxide selected from the group consisting of Al, Si, Ti, Zn, Zr and Ba, which can be synthesized through a sol-gel process. Further, $MgF_2$ and $CaF_2$ with lower refractive indices which can be formed by the sol-gel process can also be used as the porous inorganic gyroid network of the present invention. More preferably, the porous inorganic gyroid network is $SiO_2$, $TiO_2$, or $BaTiO_3$, and most preferably $SiO_2$.

Preferably, the layer of porous inorganic gyroid network has a thickness of about 100 nm to about 200 nm, more preferably about 120 nm to about 160 nm, and most preferably about 130 nm to about 150 nm.

The present invention also provides a process for preparing an antireflection structure with an exceptional low refractive index comprising the following steps:

a) coating a layer of an organic solvent solution of a block copolymer having first polymer blocks and second polymer blocks on a substrate modified with an organic material, wherein said first polymer is selected from the group consisting of poly(L-lactide), poly(D-lactide), poly(lactide), poly(acprolactone), and said second polymer is selected from the group consisting of poly(styrene), poly(vinylpyridine), and poly(acrylonitrile);

b) solvent annealing the resultant coating layer from step a) by placing the coated substrate from step a) in an atmosphere containing a vapor of nonpreferential solvent so as to form a film of the block copolymer having the second polymer blocks as a matrix thereof and the first polymer blocks having a gyroid nanostructure in the matrix;

c) selectively degrading said first polymer blocks to form correspondingly gyroid nanochannels in the matrix of said film;

d) filling an inorganic filler into the gyroid nanochannels in the matrix of said film in a liquid mixture of a filler precursor under so-gel conditions; and e) removing the second polymer block matrix of said layer by using an ultraviolet light exposure, calcination, organic solvent, a supercritical fluid or a combination thereof to obtain an layer of porous inorganic gyroid network on the substrate.

Preferably, the coating in step a) is spin coating, slot coating, gravure coating, or blade coating, and more preferably spin coating. Preferably, the spin coating has a spin rate of 1000-5000 rpm, and more preferably about 1500-4000 rpm. Preferably, the organic solvent solution has a concentration of said block copolymer ranging from 1.5-10 wt %, and more preferably about 3 wt %. The organic solvent is dichlorobenzene, chlorobenzene, dichloromethane, toluene, tetrahydrofuran and so on, and more preferably, dichlorobenzene.

Preferably, the coating layer in step a) has a thickness of about 100 nm to about 200 nm, more preferably about 120 nm to about 160 nm, and most preferably about 130 nm to about 150 nm.

Preferably, the substrate is quartz, glass, polymer, or semiconductor, and more preferably the substrate is quartz, glass, or semiconductor. More preferably, the organic material used to modify the substrate is hydroxyl terminated polystyrene, hydroxyl terminated poly(vinylpyridine), or hydroxyl terminated poly(acrylonitrile), and more preferably hydroxyl terminated polystyrene. Preferably, the hydroxyl terminated polystyrene has a molecular weight of 5000-10000, and more preferably about 9000.

Preferably, the process further comprises d') aging the inorganic filler filled in said film under controller humidity at room temperature to 70° C. for a period of 1-6 hours, prior to step e).

Preferably, said block copolymer is poly(styrene)-poly(L-lactide) (PS-PLLA) chiral block copolymer, said first polymer blocks are poly(L-lactide), and said second polymer blocks are polystyrene. Preferably, the volume fraction of the first polymer blocks such as PLLA in said block copolymer such as PS-PLLA is 36-50%, and more preferably about 40%.

Preferably, in step b) the nonpreferential solvent is dichloromethane or chloroform. In one of the preferred embodiments of the present invention the organic vapor is dichloromethane.

Preferably, in step c) the first polymer blocks are selected degraded by hydrolysis.

Preferably, in step e) the second polymer block matrix is removed by using an organic solvent, for examples tetrahydrofuran (THF) or toluene.

Preferably, in step e) the second polymer block matrix is removed by using a ultraviolet light exposure, for example a wavelength of 254 nm and an intensity of 3 mW/cm$^2$.

Preferably, the inorganic filler in step d) is a ceramic oxide or mixed oxide selected from the group consisting of Al, Si, Ti, Zn, Zr and Ba, which can be synthesized through the sol-gel process. Further, $MgF_2$ and $CaF_2$ with lower refractive indices which can be formed by the sol-gel process can also be used as the inorganic filler of the present invention. More preferably, the inorganic filler is $SiO_2$, $TiO_2$, or $BaTiO_3$, and most preferably $SiO_2$.

Preferably, the filler precursor in step d) is tetraethyl orthosilicate $((C_2H_5O)_4Si)$; titanium alkoxide, for example titanium (IV) isopropoxide; or barium hydroxide/titanium (IV) isopropoxide.

More preferably, the inorganic filler is $SiO_2$, and the filler precursor is tetraethyl orthosilicate.

DETAILED DESCRIPTION OF THE INVENTION

Figure 1:
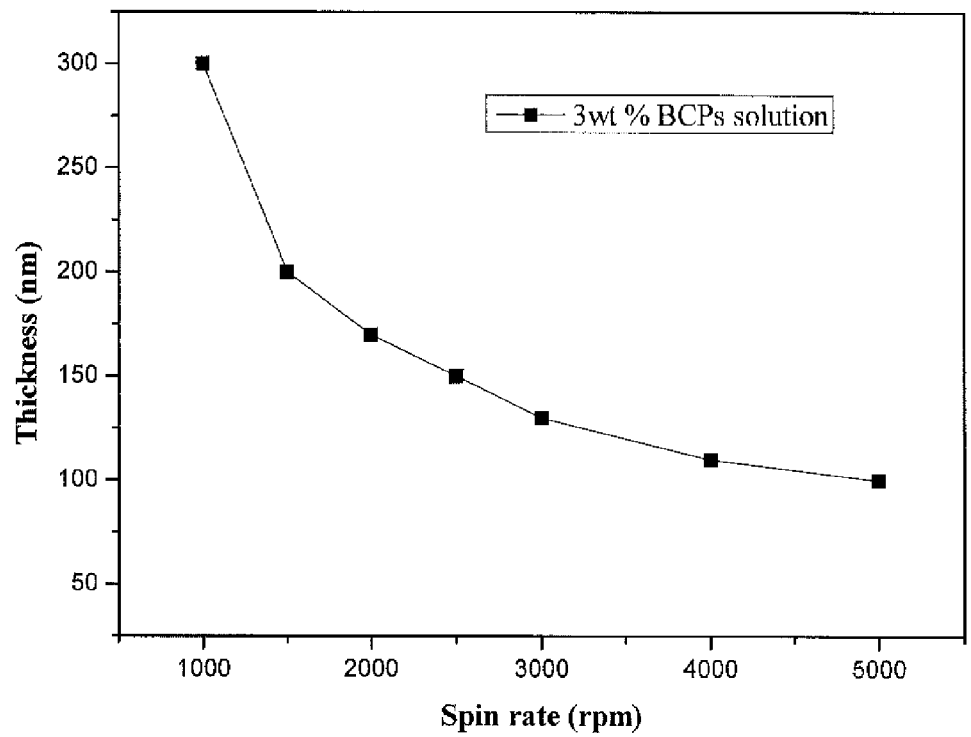
FIG. 1 is a plot showing variation of thickness of BCP thin-film samples as a function of spin rate according to a process of the present invention.

The poly(styrene)-poly(L-lactide) (PS-PLLA) chiral block copolymer and method of preparing the same has been disclosed in U.S. Pat. No. 7,135,523 B2, which forms nanoscale microstructures, including helical microstructures and cylindrical microstructures depending on the volume fraction of PLLA. US patent publication 2004/0265548 A discloses a nanopatterned template for use in manufacturing nanoscale objects, wherein a spin-coated PS-PLLA layer on a substrate is subjected to hydrolysis so that PLLA is removed to form a periodically ordered nanoporous topplogy. Rong-Ming Ho, et al. in an article entitled, "Helical Nanocomposites from Chiral Block Copolymer Templates", J. AM. CHEM. SOC. 2009, 131, 1356-1357, further use the nanoscale microstructure of OS-PLLA disclosed in U.S. Pat. No. 7,135,523 B2 to prepare a three-dimensional ordered helical nanocomposite with the incorporation of the sol-gel chemistry, so as to fabricate $SiO_2$ nanohelices.

The inventors of the present invention are the first to prepare an antireflection structure with an exceptional low refractive index, e.g. as low as 1.1, by using surface modification to the substrate and solvent annealing on the spin-coated PS-PLLA layer. These techniques help to achieve the formation of a layer of porous inorganic gyroid network on the substrate.

The following examples via experimental procedures are illustrative and are intended to demonstrate embodiments of the present invention, which, however, should not be taken to limit the embodiments of the invention to the specific embodiments, but are for explanation and understanding only, since numerous modifications and variations will be apparent to those skilled persons in this art.

Experiments

Abbreviation

L-LA: L-lactide
PS: polystyrene
PS-OH: hydroxyl terminated polystyrene
PLLA: poly(L-lactide)
PS-PLLA BCP: poly(styrene)-poly(L-lactide) chiral block copolymer
PDI: polydispersity
TEOS: tetraethyl orthosilicate
DI: deionized water
BCP: block copolymer Synthesis of PS-PLLA BCP The PS-PLLA BCP was prepared by a double-headed polymerization sequence. We described the synthesis of the PS-PLLA sample previously [Ho, R. M.; Chen, C. K.; Chiang, Y. W.; Ko, B. T.; Lin, C. C. Adv. Mater. 2006, 18, 2355-2358]. The number-average molecular weight and the molecular weight distribution (polydispersity) of the PS were determined by GPC. The polydispersity of PS-PLLA was determined by GPC and the number of L-LA repeating units was determined as a function of the number of styrene repeating units by $^1$H NMR analysis. The number-average molecular weights of PS and PLLA, and the PDI of PS-PLLA are 34000 g mol$^{-1}$, 27000 g mol$^{-1}$ and 1.26, respectively. The volume fraction of PLLA is thus calculated to be $f_{PLLA}^v$=0.39, by assuming that densities of PS and PLLA are 1.02 and 1.248 g cm$^{-3}$, respectively.

Preparation of Gyroid-Forming Thin Films

Quartz or Si wafer was cleaned by using isopropyl alcohol, acetone solution, and then rinsed with deionized Water. Consequently, the surface of substrate was modified by hydroxyl terminated polystyrene (PS-OH) with molecular weights of 9000 to increase the adhesion between of substrate and PS-PLLA thin films for the following hydrolysis process. An organic solution of PS-OH (<5%) was spin coated on the surface of the substrate with a thickness of about several nm (about 5 nm), and was annealed at 170° C. for 10 min so that PS-OH was grafted onto the surface of the substrate. Ungrafted PS-OH was removed from the substrate by rinsing with an organic solvent such as THF. The PS-PLLA thin film was spin-coated on a substrate modified with the PS-OH as brushes by spin-coating from a 3 wt % chlorobenzene solution of PS-PLLA at 50° C. Spin-coated films were placed in a dichloromethane saturated chamber at room temperature. The dichloromethane vapors swelled the thin films and annealed it to achieve the formation of well-defined gyroid-forming thin films.

Hydrolysis of PLLA

The PLLA blocks of the PS-PLLA thin films were removed by hydrolysis, using a 0.5M basic solution that was prepared by dissolving 2 g of sodium hydroxide in a 40/60 (by volume) solution of methanol/water. Owing to the thin thickness, it only took about 30 minutes. We expect a longer time for hydrolysis can be used to assure that all the PLLA blocks are removed completely. After hydrolysis, the hydrolyzed samples were rinsed using a mixture of DI water and methanol, and then used as templates for the following sol-gel reaction.

Sol-Gel Process

The silica precursor mixture was introduced into the PS templates by immersing the templates in TEOS/HCl$_{(aq.)}$ (0.1M)/methanol mixture (weight fraction of TEOS/HCl$_{(aq.)}$ (0.1M)/methanol=10/1/25) with stirring at room temperature, and then treated under controlled humidity at 50° C. for 3 h or less for aging process. After drying, PS/SiO$_2$ gyroid nanohybrid samples were prepared.

Degradation for PS Template

To produce the gyroid-forming SiO$_2$ nanostructure, the nanoporous PS template of the PS/SiO$_2$ gyroid nanohybrids was degraded by exposure to UV. The degradation was carried out under atmosphere conditions for 24 h using a UV source. The intensity of the UV source was tuned for the efficient degradation of the nanoporous PS template and did not affect the templated texture of the inorganic gyroid-forming SiO$_2$ structure. Exposure was to UV with a wave length of 254 nm and an intensity of 3 mW/cm$^2$. Consequently, the nanoporous gyroid SiO$_2$ was easily obtained on the Quartz or Si wafer.

In addition to UV exposure, organic solvent such as THF or toluene can be used for removal of PS template to obtain nanoporous gyroid thin films.

Results

Figure 2:
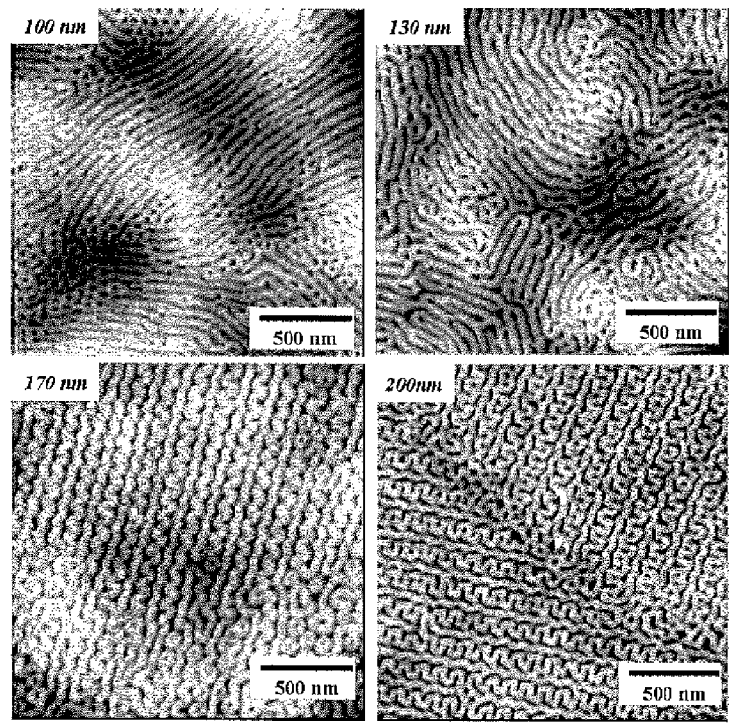
FIG. 2 are tapping-mode SPM height images of PS-PLLA thin films with increasing film thickness on Si wafer substrate grafted by PS-OH brushes after solvent annealing in a dichloromethane vapor according to a process of the present invention, where the film thickness is labeled at the left upper corner of each image.
Figure 3:
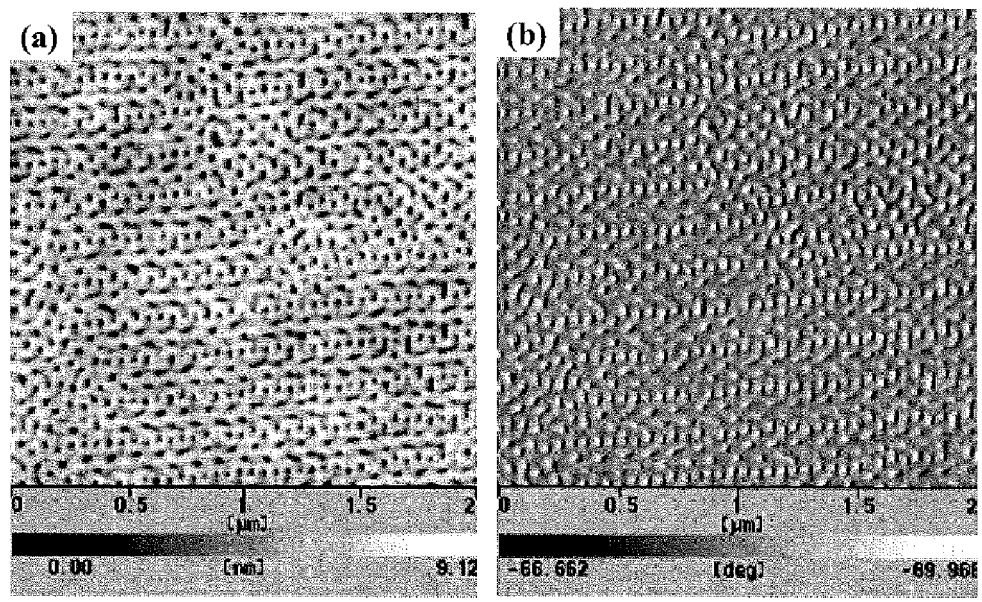
FIG. 3 are Tapping-mode SPM (a) height and (b) phase images of the gyroid-forming morphology for spin-coated PS-PLLA thin film on Si wafer substrate grafted by PS-OH brushes after solvent annealing in a dichloromethane vapor according to a process of the present invention. The film thickness of the sample is 150 nm.

In this experiment, to achieve a well-defined gyroid nanostructure with controlled thickness of around 150 nm (see FIG. 1 for the details of thickness control) satisfying the dimension requirement as antireflection structure for visible light, spin-coating process for thin-film formation was carried out first so as to create thin films with uniform thickness. Subsequently, solvent-annealing process was conducted to acquire the equilibrium morphology as gyroid nanostructure with large-scale orientation. To alleviate the effect of substrate, chemically modified substrate was prepared by using polystyrene with hydroxyl chain end. A substrate with a neutral or non-preferential wetting of the substrate for PS-PLLA could be prepared from this modification. As shown in FIG. 2, the thin-film morphologies are different to the morphology of bulk sample when the thickness of the PS-PLLA thin films is approximately smaller than 4 times of the d-spacing of the (211)$_G$ planes. As a result, the equilibrium morphology as gyroid nanostructure can be obtained for samples with thickness larger than 130 nm (see FIG. 3). Although it is possible to cause surface roughing due to the solvent-annealing treatment, the variation in thickness can be reasonably controlled by dedicated solvent removal for thick enough samples as the case examined here.

For practical applications, different coating processes, such as slot coating and gravure coating, should be available to provide cost-effective approaches for the formation of large-area coatings. In fact, a tentative test has been done by using blade coating method for the purpose. It is noted that the formation of the thin-film sample with gyroid nanostructure is thermodynamically driven process via solvent-annealing treatment in this work. As a result, similar results for the control of morphological evolution from BCP self-assembly and templating can be achieved.

Figure 4:
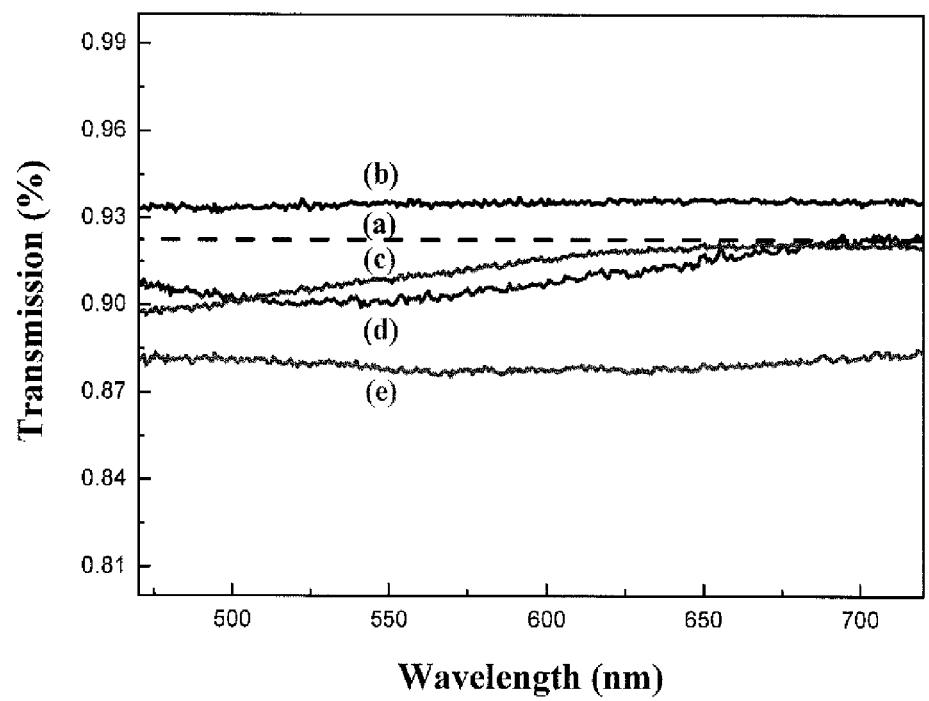
FIG. 4 shows normal-incident transmission spectra of gyroid-forming nanostructures (200 nm thickness) with different constituents on quartz substrate. (a) Quartz; (b) nanoporous gyroid $SiO_2$ prepared by a process of the present invention; (c) PS/$SiO_2$ gyroid nanohybrids; (d) PS-PLLA BCP; (e) nanoporous PS template.

FIG. 4 presents the normal-incident transmission spectra of the gyroid-forming nanostructures with different constituents on quartz substrates. The black dashed line (a) represents the transmissivity of a quartz substrate. The nanoporous gyroid $SiO_2$ sample possesses the highest transmission with respect to visible light (400 nm-800 nm), as shown in FIG. 4, line (b). Notably, the nanoporous PS template (line (e)) suffers from low transmission. We speculate that the cause for the low transmission is attributed to the scattering of visible light in well-defined two-phase materials with significant difference between the refractive indices of the constituents besides the absorbance of PS. Accordingly, the transmissions of the PS/$SiO_2$ gyroid nanohybrids (line (c)) and the PS-PLLA BCP (line (d)) are higher than that of the nanoporous PS template due to the alleviation of scattering problem. As a result, the formation of inorganic gyroid with low refractive index (estimated to be 1.1) can be successfully achieved by BCP templates.

The invention claimed is:

1. A process for preparing an antireflection structure comprising the following steps:
   a) coating a layer of an organic solvent solution of a block copolymer having first polymer blocks and second polymer blocks on a substrate modified with an organic material, wherein said first polymer is selected from the group consisting of poly(L-lactide), poly(D-lactide), poly(lactide), poly(acprolactone), and said second polymer is selected from the group consisting of poly(styrene), poly(vinylpyridine), and poly(acrylonitrile);
   b) solvent annealing the resultant coating layer from step a) by placing the coated substrate from step a) in an atmosphere containing a vapor of nonpreferential solvent so as to form a film of the block copolymer having the second polymer blocks as a matrix thereof and the first polymer blocks having a gyroid nanostructure in the matrix;
   c) selectively degrading said first polymer blocks to form correspondingly gyroid nanochannels in the matrix of said film;
   d) filling an inorganic filler into the gyroid nanochannels in the matrix of said film in a liquid mixture of a filler precursor under so-gel conditions the process further comprising d') aging the inorganic filler filled in said film under controller humidity at room temperature to 70° C. for a period of 1-6 hours, prior to step e); and the process further comprising
   wherein in step d) the inorganic filler is a ceramic oxide or mixed oxide selected from the group consisting or Al, Si, Ti, Zn, Zr and Ba; MgF2 or CaF2; and
   e) removing the second polymer block matrix of said layer by using an ultraviolet light exposure, calcination, organic solvent, a supercritical fluid or a combination thereof to obtain an layer of porous inorganic gyroid network on the substrate.

2. The process of claim 1 wherein the coating in step a) is spin coating, slot coating, gravure coating, or blade coating.

3. The process of claim 2 wherein the coating in step a) is spin coating.

4. The process of claim 3 wherein the spin coating has a spin rate of 1000-5000 rpm.

5. The process of claim 4 wherein the spin coating has a spin rate of about 1500-4000 rpm.

6. The process of claim 1 wherein the organic solvent solution has a concentration of said block copolymer ranging from 1.5-10 wt %.

7. The process of claim 6 wherein the concentration is of about 3 wt %.

8. The process of claim 1 wherein the organic solvent is dichlorobenzene, chlorobenzene, dichloromethane, toluene, or tetrahydrofuran.

9. The process of claim 8 wherein the organic solvent is dichlorobenzene.

10. The process of claim 1 wherein the coating layer in step a) has a thickness of about 100 nm to about 200 nm.

11. The process of claim 10 wherein the coating layer in step a) has a thickness of about 120 nm to about 160 nm.

12. The process of claim 11 wherein the coating layer in step a) has a thickness of about 130 nm to about 150 nm.

13. The process of claim 1 wherein the substrate is quartz, glass, or semiconductor.

14. The process of claim 13 wherein the organic material used to modify the substrate is hydroxyl terminated polystyrene, hydroxyl terminated poly(vinylpyridine), or hydroxyl terminated poly(acrylonitrile).

15. The process of claim 14 wherein the organic material used to modify the substrate is hydroxyl terminated polystyrene.

16. The process of claim 15 wherein the hydroxyl terminated polystyrene has a molecular weight of 5000-10000.

17. The process of claim 1 wherein said block copolymer is poly(styrene)-poly(L-lactide) chiral block copolymer, said first polymer blocks are poly(L-lactide), and said second polymer blocks are polystyrene.

18. The process of claim 17 wherein a volume fraction of the first polymer blocks in said block copolymer ranges from 36% to 50%.

19. The process of claim 18 wherein the volume fraction is about 40%.

20. The process of claim 1 wherein in step b) the nonpreferential solvent is dichloromethane or chloroform.

21. The process of claim 20 wherein the nonpreferential solvent is dichloromethane.

22. The process of claim 1 wherein in step c) the first polymer blocks are selected degraded by hydrolysis.

23. The process of claim 1 wherein in step e) the second polymer block matrix is removed by using an organic solvent.

24. The process of claim 23 wherein in step e) the second polymer block matrix is removed by using an organic solvent of tetrahydrofuran or toluene.

25. The process of claim 1 wherein in step e) the second polymer block matrix is removed by using a ultraviolet light exposure.

26. The process of claim 25 wherein in step e) the second polymer block matrix is removed by using a ultraviolet light exposure with a wavelength of 254 nm and an intensity of 3 mW/cm$^2$.

27. The process of claim 1 wherein the inorganic filler is $SiO_2$, $TiO_2$, or $BaTiO_3$.

28. The process of claim 27 wherein the filler precursor is tetraethyl orthosilicate, titanium (IV) isopropoxide; or barium hydroxide/titanium (IV) isopropoxide.

29. The process of claim 28 wherein the inorganic filler is $SiO_2$, and the filler precursor is tetraethyl orthosilicate.

30. The process of claim 1, wherein the coating layer in step a) has a thickness of about 100 nm to about 200 nm and the inorganic filler in step d) is $SiO_2$.

* * * * *